United States Patent [19]

Nakagawa et al.

[11] 4,391,916
[45] Jul. 5, 1983

[54] ALKALI-FREE GLASS FOR PHOTOETCHING MASK

[75] Inventors: Kenji Nakagawa, Tokorozawa; Isao Masuda, Tokyo, both of Japan

[73] Assignee: Hoya Corporation, Tokyo, Japan

[21] Appl. No.: 351,688

[22] Filed: Feb. 24, 1982

[30] Foreign Application Priority Data

Aug. 14, 1981 [JP] Japan .................. 56-126805

[51] Int. Cl.$^3$ ............................. C03C 3/10
[52] U.S. Cl. ..................... 501/62; 313/480; 501/57
[58] Field of Search ............ 501/22, 62, 57; 156/654; 430/5; 313/480

[56] References Cited

U.S. PATENT DOCUMENTS 3,069,294 12/1962 Davis .................. 501/62

FOREIGN PATENT DOCUMENTS 56-54252 5/1981 Japan .

Primary Examiner—Helen M. McCarthy
Attorney, Agent, or Firm—Sughrue, Mion, Zinn, Macpeak & Seas

[57] ABSTRACT

An alkali-free glass composition for a photoetching mask is described, which comprises, all by mol, 55 to 65% $SiO_2$, 7 to 11% $Al_2O_3$, 1 to 11% PbO, 7 to 20% CaO, 3 to 13% MgO, 3 to 13% ZnO, 0 to 3% $ZrO_2$, 0 to 3% $F_2$, 0 to 5% $As_2O_3$, and 0 to 5% $Sb_2O_3$. This glass is free from defects such as pinholes, has a relatively low coefficient of thermal expansion and contains no air bubbles, and a photoetching mask composed of the glass composition.

2 Claims, 1 Drawing Figure

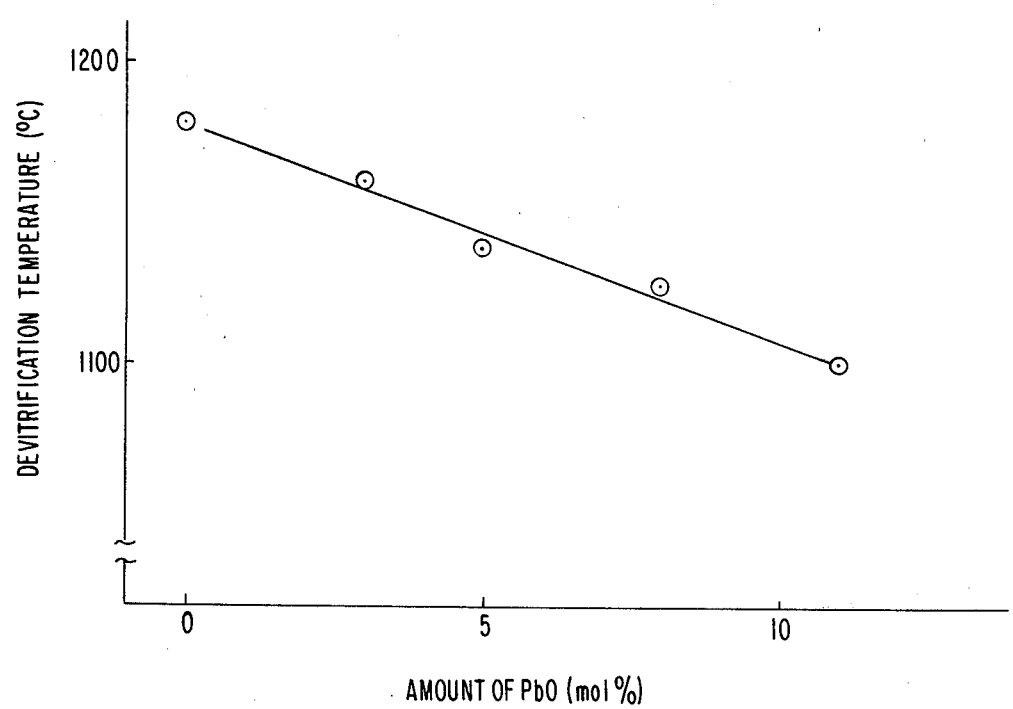

ALKALI-FREE GLASS FOR PHOTOETCHING MASK

FIELD OF THE INVENTION

The present invention relates to glass compositions for photoetching masks which are used in the preparation of integrated circuits.

BACKGROUND OF THE INVENTION

In producing integrated circuits by photoetching, a glass mask on which an integrated circuit pattern has been formed using a metal, such as chromium, is placed on a photoresist layer coated on a silicon substrate, and is then exposed to light. After the exposure, processings such as development and etching are conducted to obtain the desired integrated circuit.

Such glass masks for use in photoetching are preferably made of glass compositions which meet the following requirements:

(1) They permit sharp patterns to be formed thereon which do not have defects such as pinholes in a chromium film. Further, they have high adhesion to the chromium film and are resistant to a heat treatments or supersonic wave cleaning.

(2) They are resistant to strong acids and/or alkalis which are used in, for example, washing treatments and peeling apart photoresist layers.

(3) They have a relatively small coefficient of thermal expansion and are not subject to dimensional changes with the lapse of time.

(4) They are free of air bubbles, contaminants, cords, and the like.

Conventional glass compositions for photoetching masks include $SiO_2$-$B_2O_3$-RO-$R_2O$ and $SiO_2$-$Al_2O_3$-RO glass compositions.

The $SiO_2$-$B_2O_3$-RO-$R_2O$ compositions do not meet requirement (1) above since they contain alkali oxides and $B_2O_3$. In particular, they suffers from problems such as defects, e.g., pinholes, are readily caused in the chromium pattern film and the adhesion of the chromium pattern film is inferior. Furthermore, they have the disadvantage that they can be used only in the preparation of integrated circuits having a low degree of integration since they have a relatively high coefficient of thermal expansion, resulting from the presence of alkali oxides.

On the other hand, the $SiO_2$-$Al_2O_3$-RO compositions are free from such defects since they do not contain alkali oxides and $B_2O_3$. They have, therefore, characteristics that are satisfactory to a certain extent for the preparation not only of photoetching masks for the production of integrated circuits having a low degree of integration, but also for the preparation of masks for the production of integrated circuits having a high degree of integration.

The $SiO_2$-$Al_2O_3$-RO composition, however, has the serious disadvantages that it is difficult to remove air bubbles and cords in the production of a glass therefrom since it has a high melting point and exhibits high viscosity at the time of melting; further, the formed glass is readily contaminated with refractory bricks, etc., used in a fusing furnace. The presence of air bubbles and contaminants having a size as small as several microns is a critical defect in a mask glass.

Methods which are known to lower viscosity at the time of melting include: (1) a method in which $B_2O_3$ is added in the case of Glass 7059, etc., produced by Corning Glass Corp., which glasses are commercially available; (2) a method in which the ratio of the RO component to the $SiO_2$-$Al_2O_3$ component is increased; and (3) a method in which ZnO is added as the RO component, as is described in Japanese Patent Publication No. 54252/81.

Method (1) above, however, as has already been described above, may cause the formation of defects such as pinholes in the pattern film, and reduce the adhesive force of the pattern film. Method (2) is not recommendable in that it increases the coefficient of thermal expansion of the formed glass. Method (3) is disadvantageous in that the viscosity-decreasing effect of ZnO is small, it should be used in the form of zinc oxide (ZnO) and cannot be used in the form of $ZnCO_3$ or $Zn(NO_3)_2$, which have the effect of removing air bubbles, and, therefore, an insufficient effect of removing air bubbles can be expected.

SUMMARY OF THE INVENTION

As a result of extensive studies on $SiO_2$-$Al_2O_3$-RO glass compositions to develop such glass compositions for photoetching masks meeting requirements (1) to (4) as described hereinbefore, and having good melt properties, it has been found that the use of CaO, MgO and ZnO in combination as the RO component and the incorporation of PbO provides the desired glass composition for photoetching masks.

The present invention, therefore, provides a glass composition for a photoetching mask, consisting essentially of, all by mol%, 55 to 65% $SiO_2$, 7 to 11% $Al_2O_3$, 1 to 11% PbO, 7 to 20% CaO, 3 to 13% MgO, 3 to 13% ZnO, 0 to 3% $ZrO_2$, 0 to 3% $F_2O$, 0 to 5% $As_2O_3$, and 0 to 5% $Sb_2O_3$.

BRIEF DESCRIPTION OF THE DRAWING

The FIGURE is a graph showing the relationship between the PbO content of the glass composition of the invention and the devitrification temperature thereof.

DETAILED DESCRIPTION OF THE INVENTION

In the glass compositions of the invention, the $SiO_2$ content is within the range of from 55 mol% to 65 mol%. When the $SiO_2$ content is more than 65 mol%, the melt properties of the glass are deteriorated and the viscosity is increased, whereas when it is less than 55 mol% the coefficient of thermal expansion is increased and only an unstable glass having poor durability is obtained.

$Al_2O_3$ mainly contributes to the stability of the glass of the invention, and its content is within the range of from 7 mol% to 11 mol%. For stabilization of the glass, in general, it is most preferred to control the $Al_2O_3$ content to about 9 mol %.

In the glass composition of the invention, the three elements of CaO, MgO and ZnO are used in combination as the RO component. Of these elements, CaO is the most significant one to increase the stability and durability of the glass. MgO is somewhat inferior to CaO with respect to increasing the stability and durability of the glass, but it is most effective in lowering the coefficient of thermal expansion. ZnO has effects similar to those of MgO.

When the characteristics required for a glass composition for photoetching masks are totally considered, it is preferred to adjust the ratio of CaO to MgO to ZnO to 1/1/1. That is, when the amount of any one of the three elements is too large or small, the stability and durability of the glass are deteriorated. In the glass composition of the invention, therefore, CaO, MgO, and ZnO are added in the same amount under the conditions that CaO is within the range of from 7 to 20 mol%, and each of MgO and ZnO is within the range of from 3 to 13 mol%; alternatively CaO can be added in somewhat greater amounts than the other two compounds. However, when it is mainly intended to lower the coefficient of thermal expansion, the MgO content may be increased, e.g., 13 mol%.

In addition to the $SiO_2$, $Al_2O_3$ and RO components, the glass composition of the invention contains PbO as an essential component. According to the invention, it has been found that PbO has the effects of lowering the viscosity of the glass and of improving the melt properties as is the case with alkali oxides and $B_2O_3$, and, furthermore, it has the effects of increasing the stability of the glass and lowering the devitrification temperature by about 50° to 80° C. In contrast with the alkali oxides and $B_2O_3$, however, PbO does not increase the coefficient of thermal expansion, and furthermore, does not cause the formation of pinholes in a chromium pattern film and deterioration of adhesive force.

The above-described effects of PbO are obtained when it is added within the range of from 1 mol% to 11 mol%. When the PbO content is more than 11 mol%, the blue-coloration effect of the glass cannot be disregarded.

The relationship between the glass devitrification temperature and the PbO content when the RO component of a glass composition comprising 59.0 mol% $SiO_2$, 9.0 mol% $Al_2O_3$, and 32 mol% of the RO component is replaced with PbO is shown in the FIGURE. It can be seen that as the PbO content is increased (i.e., the RO component content is decreased), the devitrification temperature is lowered.

$ZrO_2$ is not an essential component. The addition of $ZrO_2$ has the effects of improving the durability of the glass and of lowering the coefficient of thermal expansion, although it slightly increases viscosity. In this respect, the addition of $ZrO_2$ is more effective than increasing the $SiO_2$ content. However, since the addition of a large amount of $ZrO_2$ deteriorates the stability of the glass, the maximum amount of $ZrO_2$ added is 3 mol%.

Similarly, although fluorine ($F_2$) is not an essential component, the addition of fluorine is effective to decrease viscosity. However, the addition of a large amount of fluorine deteriorates the durability of the glass, and therefore, the amount of fluorine added should be controlled to 3 mol% or less. With either $ZrO_2$ or fluorine, when the amount thereof is less than 0.5 mol%, the above-described effects cannot be obtained.

As in the case of the production of conventional glass compositions, the glass composition of the invention may contain, if desired or necessary, $As_2O_3$ and/or $Sb_2O_3$ as a defoaming agent. These defoaming agents should be added in an amount of 5 mol% or less.

The following example is given to illustrate the invention in greater detail.

TABLE 1

| No. | Glass Composition (mol %) | | | | | | | |
|---|---|---|---|---|---|---|---|---|
| | $SiO_2$ | $Al_2O_3$ | CaO | MgO | ZnO | PbO | $ZrO_2$ | $F_2$ |
| 1 | 60.0 | 9.0 | 9.4 | 9.3 | 9.3 | 3.0 | — | — |
| 2 | 61.0 | 9.0 | 10.7 | 10.7 | 7.0 | 1.6 | — | — |
| 3 | 60.0 | 9.0 | 8.7 | 8.7 | 8.6 | 3.0 | 2.0 | — |
| 4 | 58.0 | 9.0 | 10.9 | 10.9 | 8.7 | 1.5 | 1.0 | — |
| 5 | 59.0 | 9.0 | 20.0 | 3.0 | 3.0 | 3.0 | — | — |
| 6 | 59.0 | 9.0 | 7.0 | 7.0 | 7.0 | 11.0 | — | — |
| 7 | 59.0 | 9.0 | 9.5 | 9.5 | 8.0 | 5.0 | — | — |
| 8 | 59.0 | 9.0 | 13.5 | 6.8 | 6.7 | 5.0 | — | — |
| 9 | 59.0 | 9.0 | 7.0 | 13.0 | 7.0 | 5.0 | — | — |
| 10 | 59.0 | 9.0 | 7.0 | 7.0 | 13.0 | 5.0 | — | — |
| 11 | 65.0 | 9.0 | 7.7 | 7.7 | 7.6 | 3.0 | — | — |
| 12 | 55.0 | 9.0 | 11.7 | 11.7 | 11.7 | 1.0 | — | — |
| 13 | 59.0 | 9.0 | 10.7 | 10.7 | 9.6 | 1.0 | — | 3.0 |
| 14 | 57.0 | 12.0 | 11.0 | 11.0 | 8.0 | 1.0 | — | — |
| 15 | 63.0 | 7.0 | 10.5 | 10.5 | 8.0 | 1.0 | — | — |

Glasses having the formulations shown in Table 1 above were prepared by melting the corresponding feedstock at 1,400° to 1,500° C. and then cooling at a rate of 10° C. per hour. The characteristics of the glasses thus-prepared were evaluated, and the results are shown in Table 2.

The coefficient of thermal expansion was determined within the temperature range of from 50° C. to 200° C., and the glass transition temperature was determined by a graph showing the change of coefficient of thermal expansion with temperature. The liquid layer temperature, which is a measure of stability, was determined by placing a piece of glass on a platinum plate, holding it for 3 hours in an oven which was heated at a constant temperature-raising rate, and by measuring the upper limit of the temperature at which devitrification of the glass occurred. In the scorching test with a strong acid solution for washing, the glass was soaked for 30 minutes in a dichromic acid mixed solution (prepared by adding 70 g of potassium dichromate to 2 liters of concentrated sulfuric acid) maintained at 90° C. and the formation of any abnormality on the surface of the glass was observed. In the mouth nip test of chromium film, a 2.5 square inch glass plate was washed, subjected to chromium coating and patterning, and then, heat treated at 200° C. for 30 minutes, whereafter, the formation of mouth nip (pinholes) was examined.

TABLE 2

| Run No. | Coefficient of Thermal Expansion ($\times 10^{-7}$/°C.) | Glass Transition Temperature (°C.) | Liquid Layer Temperature (°C.) | Knoop Hardness (kg/mm$^2$) | Strong Acid Solution Scorching Test | Mouth Nip Test |
|---|---|---|---|---|---|---|
| 1 | 46 | 698 | 1,170 | 647 | No abnormality | No formation |
| 2 | 42 | 725 | 1,180 | 654 | " | " |
| 3 | 44 | 735 | 1,190 | 641 | " | " |
| 4 | 43 | 718 | 1,180 | — | " | " |
| 5 | 48 | 742 | 1,150 | 640 | " | " |
| 6 | 43 | 642 | 1,100 | — | " | " |
| 7 | 41 | 710 | 1,140 | 648 | " | " |
| 8 | 46 | 720 | 1,150 | — | " | " |
| 9 | 45 | 722 | 1,200 | 660 | " | " |
| 10 | 39 | 703 | 1,180 | — | " | " |

TABLE 2-continued

| Run No. | Coefficient of Thermal Expansion ($\times 10^{-7}/°C$) | Glass Transition Temperature (°C) | Liquid Layer Temperature (°C) | Knoop Hardness (kg/mm$^2$) | Strong Acid Solution Scorching Test | Mouth Nip Test |
|---|---|---|---|---|---|---|
| 11 | 42 | 742 | 1,200 | 687 | " | " |
| 12 | 49 | 681 | 1,210 | — | " | " |
| 13 | 45 | 740 | 1,170 | — | " | " |
| 14 | 39 | 742 | 1,250 | 662 | " | " |
| 15 | 41 | 740 | 1,230 | — | " | " |

As can be seen from the results shown in Table 2 above, the glass of the invention has a coefficient of thermal expansion as low as $40 \times 10^{-7}$ to $50 \times 10^{-7}/°C$., and a Knoop hardness of at least about 640 kg/mm$^2$, i.e., has a sufficiently high glass hardness, and thus, it has the feature of good resistance against thermal shock.

The glass of the invention also has good durability against strong acids used in washing and resist removal steps, and even if the pattern is formed with a metal (e.g., chromium) vapor deposited film, the strength of the formed pattern is sufficient, and defects such as pinholes are not caused.

Furthermore, with regard to viscosity at the time of melting, the temperature at which the viscosity is 200 poises is 1,350° C. to 1,400° C., and, thus, melt properties are good.

According to the invention, therefore, an air bubble-free masking glass having the basic composition of SiO$_2$-Al$_2$O$_3$-RO can be produced at lower temperatures than for the conventional glasses and at low production costs.

Since the glass of the invention contains no alkali, it has a high specific resistance, and, furthermore, it has the feature that it rarely deteriorates a NESA coating.

Furthermore, since it contains PbO, electron beam solarization is low and moldability is good. Thus, the glass of the invention is suitable not only as a glass for a photoetching mask, but also as a substrate glass for use in the electronics industry, such as in a face plate.

While the invention has been described in detail and with reference to specific embodiments thereof, it will be apparent to one skilled in the art that various changes and modifications can be made therein without departing from the spirit and scope thereof.

What is claimed is:

1. An alkali-free glass for a photoetching mask, consisting essentially of, 55 to 65% SiO$_2$, 7 to 11% Al$_2$O$_3$, 1 to 11% PbO, 7 to 20% CaO, 3 to 13% MgO, 3 to 13% ZnO, 0 to 3% ZrO$_2$, 0 to 3% F$_2$, 0 to 5% As$_2$O$_3$ and 0 to 5% Sb$_2$O$_3$, wherein all percents are molar.

2. A photoetching mask, consisting essentially of an alkali-free glass which consists essentially of 55 to 65% SiO$_2$, 7 to 11% Al$_2$O$_3$, 1 to 11% PbO, 7 to 20% CaO, 3 to 13% MgO, 3 to 13% ZnO, 0 to 3% ZrO$_2$, 0 to 3% F$_2$, 0 to 5% As$_2$O$_3$ and 0 to 5% Sb$_2$O$_3$, wherein all percents are molar.

* * * * *